US012813006B2

(12) United States Patent
Jiang et al.

(10) Patent No.: US 12,813,006 B2
(45) Date of Patent: Nov. 24, 2026

(54) BACK JUNCTION SOLAR CELL AND PREPARATION METHOD THEREFOR

(71) Applicant: JA SOLAR TECHNOLOGY YANGZHOU CO., LTD., Yangzhou City (CN)

(72) Inventors: Xiulin Jiang, Yangzhou City (CN); Bin Chen, Yangzhou City (CN); Wei Shan, Yangzhou City (CN)

(73) Assignee: JA SOLAR TECHNOLOGY YANGZHOU CO., LTD (CN)

(*) Notice: Subject to any disclaimer, the term of this patent is extended or adjusted under 35 U.S.C. 154(b) by 0 days.

(21) Appl. No.: 18/993,923

(22) PCT Filed: Nov. 18, 2022

(86) PCT No.: PCT/CN2022/132919
§ 371 (c)(1),
(2) Date: Jan. 13, 2025

(87) PCT Pub. No.: WO2024/011808
PCT Pub. Date: Jan. 18, 2024

(65) Prior Publication Data

US 2026/0020372 A1 Jan. 15, 2026

(30) Foreign Application Priority Data

Jul. 12, 2022 (CN) ........................ 202210816392.3

(51) Int. Cl.
*H10F 77/20* (2025.01)
*H10F 71/00* (2025.01)
(Continued)

(52) U.S. Cl.
CPC ....... *H10F 77/215* (2025.01); *H10F 71/1221* (2025.01); *H10F 71/129* (2025.01);
(Continued)

(58) Field of Classification Search
None
See application file for complete search history.

(56) References Cited

U.S. PATENT DOCUMENTS 8,536,447 B2 9/2013 Du et al.
2009/0014063 A1 1/2009 Stangl et al.
(Continued)

FOREIGN PATENT DOCUMENTS

CN 103560176 A 2/2014
CN 105405910 A 3/2016
(Continued)

OTHER PUBLICATIONS

English language machine translation of CN 112133763 A. (Year: 2026).*
(Continued)

*Primary Examiner* — Eli S Mekhlin
(74) *Attorney, Agent, or Firm* — Haynes and Boone, LLP

(57) ABSTRACT

A back junction solar cell and a preparation method therefor are disclosed. The back junction solar cell comprises: a P-type silicon substrate; a tunneling oxide layer, an N-type doped silicon layer and a first passivation anti-reflection layer sequentially arranged on a first main surface of the P-type silicon substrate in a stacked manner from inside to outside; a back electrode which penetrates through the first passivation anti-reflection layer to be electrically connected with the N-type doped silicon layer; a P+ local front surface field formed by Group III elements and a front electrode formed by Group III elements arranged on a second main surface of the P-type silicon substrate; a second passivation anti-reflection layer formed on the second main surface of the P-type silicon substrate in a region where the front electrode is not arranged and on the front and lateral sides of the front electrode.

10 Claims, 5 Drawing Sheets

(51) Int. Cl.
*H10F 77/00* (2025.01)
*H10F 77/122* (2025.01)
*H10F 77/30* (2025.01)

(52) U.S. Cl.
CPC ......... *H10F 71/134* (2025.01); *H10F 77/122* (2025.01); *H10F 77/315* (2025.01); *H10F 77/937* (2025.01); *H10F 77/939* (2025.01)

(56) References Cited

U.S. PATENT DOCUMENTS

| | | | | |
|---|---|---|---|---|
| 2009/0277502 | A1 | 11/2009 | Yoshida et al. | |
| 2010/0243024 | A1* | 9/2010 | Hashimoto | H10F 77/937 136/244 |
| 2011/0308608 | A1* | 12/2011 | Shim | H10F 77/1642 136/258 |
| 2012/0006385 | A1* | 1/2012 | Hassan | H10F 19/35 136/246 |
| 2013/0171767 | A1* | 7/2013 | Moslehi | H10F 71/128 438/89 |

FOREIGN PATENT DOCUMENTS

| | | | |
|---|---|---|---|
| CN | 105679845 | A | 6/2016 |
| CN | 109103299 | A | 12/2018 |
| CN | 109585578 | A | 4/2019 |
| CN | 115020525 | A | 9/2022 |
| EP | 2669952 | A1 | 12/2013 |
| JP | S5979580 | | 5/1984 |
| JP | H05259487 | A | 10/1993 |
| TW | M527159 | U | 8/2016 |

OTHER PUBLICATIONS

Extended European Search Report dated Oct. 6, 2025 in related European Patent Application No. 22950916.1.

* cited by examiner

BACK JUNCTION SOLAR CELL AND PREPARATION METHOD THEREFOR

CROSS-REFERENCE TO RELATED APPLICATIONS

This application is the national phase of PCT International Application No. PCT/CN2022/132919, filed Nov. 18, 2022, which claims the benefit of and priority to Chinese patent application 202210816392.3, filed Jul. 12, 2022, the entire contents of each of which is hereby incorporated herein in its entirety by express reference thereto.

TECHNICAL FIELD

The present disclosure relates to a back junction solar cell and a preparation method therefor.

BACKGROUND ART

At present, in order to overcome a recombination of a doped silicon layer arranged on the light-receiving side of a solar cell with electron-hole pairs generated by the solar cell and overcome the influences of the doped silicon layer on the absorption of incident light by the solar cell, and meanwhile, in order to overcome the influences of the preparation of a back surface field through high temperature or laser grooving on the performance of the solar cell, there is provided a back junction solar cell with a front surface field.

As for a front surface field of an existing back junction solar cell, a metal aluminum paste disposed on a passivation anti-reflection layer is caused to burn through a passivation layer and the passivation anti-reflection layer disposed on a front side of the solar cell by a sintering method, and then the metal aluminum paste is subjected to a doping reaction with a silicon substrate to form an aluminum doped local front surface field and a front electrode connected to the local front surface field. During the formation of the front surface field and the front electrode of such an existing back junction solar cell, the passivation layer and the passivation anti-reflection layer arranged on the front side of the solar cell will be damaged, which affects the anti-reflection and the passivation effects and causes a reduction in the short-circuit current and the open-circuit voltage, thereby resulting in a decline of the photoelectric conversion rate of the solar cell.

SUMMARY OF THE INVENTION

In view of this, the technical problem to be solved by the present disclosure is to provide a back junction solar cell and a preparation method therefor.

In order to solve the above technical problem, the present disclosure provides the following technical solutions:

In a first aspect, the present disclosure provides a back junction solar cell, comprising:

a P-type silicon substrate;

a tunneling oxide layer, an N-type doped silicon layer and a first passivation anti-reflection layer which are sequentially arranged on a first main surface of the P-type silicon substrate in a stacked manner from inside to outside;

a back electrode which penetrates through the first passivation anti-reflection layer to be electrically connected with the N-type doped silicon layer;

a P+ local front surface field formed by Group III elements and a front electrode formed by Group III elements arranged on a second main surface of the P-type silicon substrate, wherein the front electrode is connected to the local front surface field, and the position of the local front surface field corresponds to the position of the front electrode;

a second passivation anti-reflection layer formed on the second main surface of the P-type silicon substrate in a region where the front electrode is not arranged and on the front and lateral sides of the front electrode.

In a second aspect, an embodiment of the present disclosure provides a preparation method for the back junction solar cell provided in the embodiment of the first aspect, comprising:

step S1: forming a tunneling oxide layer on a first main surface of a P-type silicon substrate;

step S2: forming an N-type doped silicon layer on the tunneling oxide layer;

step S3: forming a front electrode on a second main surface of the P-type silicon substrate using Group III elements;

step S4: forming a first passivation anti-reflection layer on the N-type doped silicon layer, and forming a second passivation anti-reflection layer on the second main surface of the P-type silicon substrate in a region where the front electrode is not arranged and on the front and lateral sides of the front electrode.

step S5: printing a back electrode on the first passivation anti-reflection layer;

step S6: performing a sintering process to carry out a doping reaction between Group III elements of the front electrode and a partial region of the P-type silicon substrate so as to form a local P+ front surface field and cause the back electrode to burn through the first passivation anti-reflection layer so as to form a structure in which the back electrode is electrically connected with the N-type doped silicon layer.

In a third aspect, an embodiment of the present disclosure provides a photovoltaic module, comprising: a cell sheet made of the back-junction solar cell provided in the embodiment of the first aspect.

In a fourth aspect, an embodiment of the present disclosure provides a power station, comprising: the photovoltaic module provided in the embodiment of the third aspect.

The technical solution of the first aspect as disclosed above has the following advantages or beneficial effects:

For the back junction solar cell provided by the present disclosure, a solar cell with a back junction structure is realized, since the first main surface of the P-type silicon substrate is provided with a tunneling oxide layer, an N-type doped silicon layer and a first passivation anti-reflection layer which are sequentially arranged in a stacked manner from inside to outside and with a back electrode which penetrates through the first passivation anti-reflection layer to be electrically connected with the N-type doped silicon layer, and the second main surface of the P-type silicon substrate is provided with a P+ local front surface field formed by Group III elements and a front electrode formed by Group III elements; in addition, an effective light absorbing region of the back junction solar cell can be effectively increased and the photoelectric conversion efficiency of the back junction solar cell can be effectively improved, since the front electrode is connected to the local front surface field, and the position of the local front surface field corresponds to the position of the front electrode. Furthermore, since a second passivation anti-reflection layer is formed on the second main surface of the P-type silicon substrate in a region where the front electrode is not arranged and on the front and lateral sides of the front electrode, damage caused by the front electrode to the passivation anti-reflection layer on the front side of the solar cell is avoided, which effectively improves the anti-reflection and passivation effects of the front side of the solar cell and increases the short-circuit current and the open-circuit voltage, thereby effectively improving the photoelectric conversion efficiency of the solar cell.

REFERENCE SIGNS ARE AS FOLLOWS

1 a P-type silicon substrate; 2 a tunneling oxide layer; 3 an N-type doped silicon layer; 4 a first passivation anti-reflection layer; 5 a back electrode; 6 a P+ local front surface field; 7 a front electrode; 71 a finger; 72 a busbar; 8 a second passivation anti-reflection layer; 9 a front pad; 10 a metal nickel barrier layer.

DETAILED DESCRIPTION OF THE EMBODIMENTS

Figure 1:
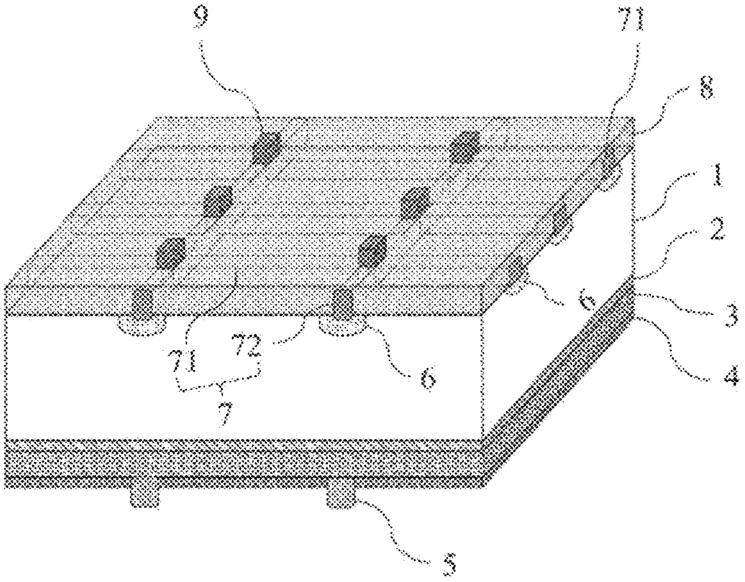
FIG. 1 is a stereoscopic diagram of a first structure of a back junction solar cell provided according to an embodiment of the present disclosure.
Figure 3:
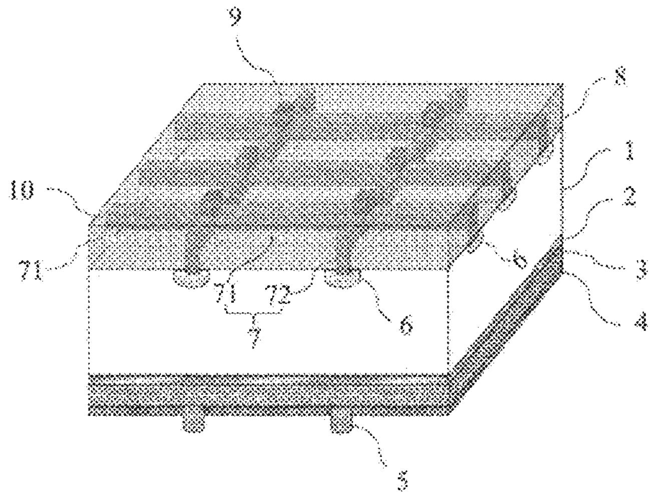
FIG. 3 is a stereoscopic diagram of a second structure of a back junction solar cell provided according to an embodiment of the present disclosure.
Figure 5:
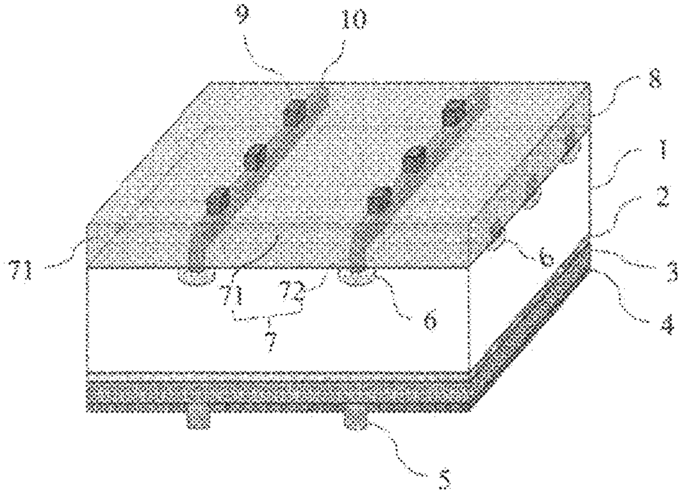
FIG. 5 is a stereoscopic diagram of a third structure of a back junction solar cell provided according to an embodiment of the present disclosure.

The stacked arrangement from inside to outside, involved in the embodiments of the present disclosure, refers to taking one structure as a starting point and stacking a plurality of other structures in a direction away from the structure. For example, as for the tunneling oxide layer 2, the N-type doped silicon layer 3 and the first passivation anti-reflection layer 4 which are sequentially arranged on the first main surface of the P-type silicon substrate 1 in a stacked manner from inside to outside as shown in FIGS. 1, 3 and 5, the first main surface of the P-type silicon substrate 1 is taken as a starting point, and the tunneling oxide layer 2, the N-type doped silicon layer 3 and the first passivation anti-reflection layer 4 are sequentially arranged in a direction away from the first main surface of the P-type silicon substrate 1, wherein the tunneling oxide layer 2 is in direct contact with the P-type silicon substrate 1, i.e., the tunneling oxide layer 2 is closest to the first main surface of the P-type silicon substrate 1, the N-type doped silicon layer 3 is stacked on the tunneling oxide layer 2, and the first passivation anti-reflection layer 4 is stacked on the N-type doped silicon layer 3.

In addition, the concept that one structure is stacked or arranged on another structure, involved in the embodiments of the present disclosure, means that the one structure is in direct or indirect contact with another structure and the two structures form a relatively fixed combination.

The concept that one structure penetrates through another structure, involved in the embodiments of the present disclosure, means that a portion of the one structure passes from one side of another structure to the other side of another structure in a thickness direction of another structure. For example, the concept that the back electrode penetrates through the first passivation anti-reflection layer means that a portion of the back electrode passes from one side of the first passivation anti-reflection layer to the other side of the first passivation anti-reflection layer.

In addition, the first main surface and the second main surface of the P-type silicon substrate refer to two surfaces of the P-type silicon substrate which are arranged opposite to each other, have relatively large areas and serve as a light receiving surface (a surface facing the sun) or a backlight surface (a surface away from the sun) of the solar cell, wherein "first" and "second" in the first main surface and the second main surface are only for the purpose of distinguishing the two surfaces of the P-type silicon substrate which respectively serve as a backlight surface of the solar cell and a light receiving surface of the solar cell, other than limiting the number or sequence of the main surfaces.

The concept that one structure is connected or electrically connected to another structure, involved in the embodiments of the present disclosure, means that the one structure is in direct or indirect contact with another structure.

In order to solve the problem of an existing back junction solar cell that damage caused by a front electrode to a passivation anti-reflection layer results in damage to a passivation anti-reflection layer in edge regions of the front electrode and leads to poor passivation and anti-reflection effects of the back junction solar cell, the embodiments of the present disclosure provide a back junction solar cell, wherein FIGS. 1, 3 and 5 show stereoscopic diagrams of back junction solar cells with different structures, respectively. As shown in FIGS. 1, 3 and 5, the back junction solar cells may comprise:

a P-type silicon substrate 1;

a tunneling oxide layer 2, an N-type doped silicon layer 3 and a first passivation anti-reflection layer 4 which are sequentially arranged on a first main surface of the P-type silicon substrate 1 in a stacked manner from inside to outside;

a back electrode 5 which penetrates through the first passivation anti-reflection layer 4 to be electrically connected with the N-type doped silicon layer 3;

a P+ local front surface field 6 formed by Group III elements and a front electrode 7 formed by Group III elements arranged on a second main surface of the P-type silicon substrate 1, wherein the front electrode 7 is connected to the local front surface field 6, and the position of the local front surface field 6 corresponds to the position of the front electrode 7;

a second passivation anti-reflection layer 8 formed on the second main surface of the P-type silicon substrate 1 in a region where the front electrode 7 is not arranged and on the front and lateral sides of the front electrode 7.

Herein, the N-type doped silicon layer 3 may be an N-type doped polysilicon layer or may be an N-type doped amorphous silicon layer, and in one preferred embodiment, the N-type doped silicon layer 3 is an N-type doped polysilicon layer.

Herein, the back electrode 5 may be silver metal grid lines or aluminum metal grid lines, so that current can be easily derived from the N-type doped silicon layer 3.

Herein, the concept that the position of the local front surface field 6 corresponds to the position of the front electrode 7 means that all projections of all positions of the front electrode 7 on the second main surface of the P-type silicon substrate 1 fall on a local front surface field 6. That is, the width of the local front surface field 6 is generally greater than or equal to the width of the front electrode 7. In one preferred embodiment, the width of the local front surface field 6 is equal to the width of the front electrode 7, so as to realize a front emitter while reducing the occlusion of the light absorbing region of the back junction solar cell by the local front surface field 6, which helps to improve the photoelectric conversion efficiency of the back junction solar cell.

In addition, since the first main surface of the P-type silicon substrate is provided with a tunneling oxide layer, an N-type doped silicon layer and a first passivation anti-reflection layer which are sequentially arranged in a stacked manner from inside to outside and with a back electrode which penetrates through the first passivation anti-reflection layer to be electrically connected with the N-type doped silicon layer, and the second main surface of the P-type silicon substrate is provided with a P+ local front surface field formed by Group III elements and a front electrode formed by Group III elements, a solar cell with a back junction structure is realized, which reduces the occlusion of the light absorbing region, and meanwhile, reduces the front metal-semiconductor recombination, decreases the front metal-semiconductor contact resistance, avoids the influences of the doped silicon layer on the absorption of incident light, and improves the current collection efficiency of the solar cell. In addition, since the front electrode is connected to the local front surface field and the position of the local front surface field corresponds to the position of the front electrode, the effective light absorbing region of the back junction solar cell can be effectively increased, and the photoelectric conversion efficiency of the back junction solar cell can be effectively improved. The P+ local front surface field 6 formed by Group III elements and the front electrode 7 formed by Group III elements can effectively reduce carrier recombination in a metal-semiconductor contact region.

Further, since a second passivation anti-reflection layer is formed on the second main surface of the P-type silicon substrate in a region where the front electrode is not arranged and on the front and lateral sides of the front electrode, damage caused by the front electrode to the passivation anti-reflection layer on the front side of the solar cell is avoided, which effectively improves the anti-reflection and passivation effects of the front side of the solar cell. An increase in the anti-reflection effect can result in an increase in the short-circuit current of the solar cell, and an increase in the passivation effect can result in an increase in the open circuit voltage of the solar cell, i.e., can result in an improvement of the photoelectric conversion efficiency of the solar cell to a certain extent.

In the embodiments of the present disclosure, as shown in FIGS. 1, 3 and 5, the above back junction solar cell may further comprise: a front pad 9 which penetrates through the second passivation anti-reflection layer 8 to be electrically connected with the front electrode 7. With the aid of the front pad 9 and a solder strip, a cell string can be manufactured subsequently, wherein the front pad 9 is generally a metal silver pad, and wherein a relatively good connection structure can be formed between the metal silver pad and the solder strip, so as to ensure the conductivity and current collection capability of the cell string to be manufactured subsequently.

Figure 2:
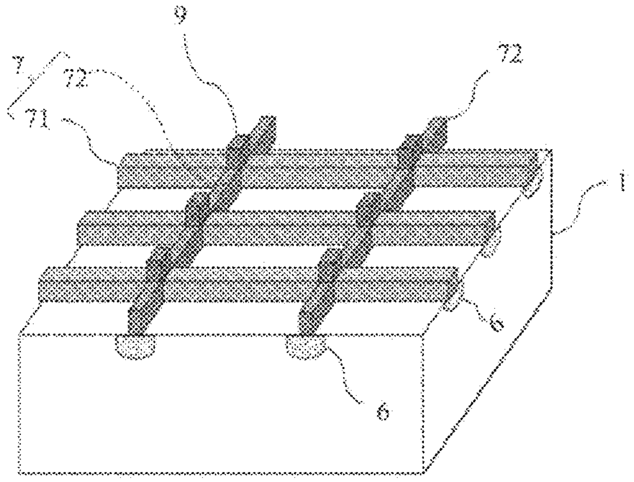
FIG. 2 is a schematic diagram of the relative relationship of various components on the front side of the back junction solar cell in FIG. 1 provided according to an embodiment of the present disclosure.
Figure 4:
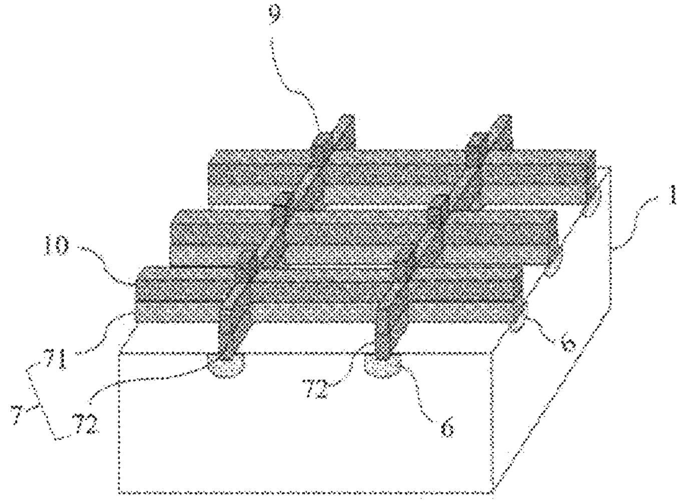
FIG. 4 is a schematic diagram of the relative relationship of various components on the front side of the back junction solar cell in FIG. 3 provided according to an embodiment of the present disclosure.
Figure 6:
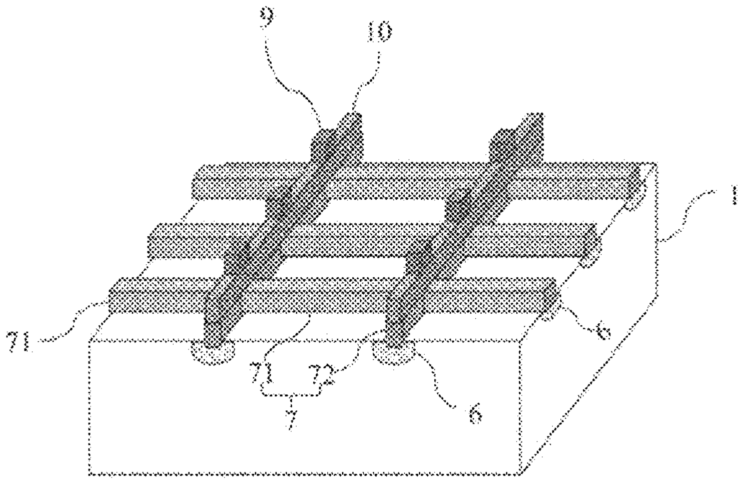
FIG. 6 is a schematic diagram of the relative relationship of various components on the front side of the back junction solar cell in FIG. 5 provided according to an embodiment of the present disclosure.

In addition, as for the front electrode 7 of the back junction solar cell provided in the embodiments of the present disclosure, FIGS. 2, 4 and 6 show stereoscopic diagrams of the relative positional relationship of the P-type silicon substrate, the local front surface field 6, the front electrode 7 and the front pad 9. As shown in FIGS. 1 to 6, the front electrode 7 may include a plurality of fingers 71 and a plurality of busbars 72 crossing the plurality of fingers 71, wherein

- each of the fingers 71 and each of the busbars 72 correspond to their own local front surface fields 6, respectively;
- each of the fingers 71 and each of the busbars 72 are connected to their corresponding local front surface fields 6, respectively.

Different from the design of an existing solar cell in which busbars are used as a bridge for collecting the current of fingers and guiding the collected current through solder strips, the design of the back junction solar cell provided according to the embodiments of the present disclosure, in which the plurality of fingers 71 and the plurality of busbars 72 of the front electrode 7 correspond to their own local front surface fields respectively and are connected to their corresponding local front surface fields respectively, enables the busbars 72 to collect the current of the fingers 71, and besides, the design of front surface fields below the busbars 72 can reduce the open voltage of the back junction solar cell while reducing the carrier recombination of the back junction solar cell and realizing the function of an emitter, thereby further improving the photoelectric conversion efficiency of the back junction solar cell.

Herein, the above front pad 9 is generally electrically connected to the busbar 72.

Further, the local front surface fields 6 are formed by doping Group III elements of the corresponding front electrodes 7 into partial regions of the P-type silicon substrate 1. That is, a local front surface field 6 corresponding to a finger 71 is formed by doping Group III elements of the finger 71 into a region of the P-type silicon substrate 1 corresponding to the finger 71, and a local front surface field 6 corresponding to a busbar 72 is formed by doping Group III elements of the busbar 72 into a region of the P-type silicon substrate 1 corresponding to the busbar 72. This eliminates the need to set the local front surface fields 6 separately, and the local front surface fields 6 can be formed by doping Group III elements of the fingers 71 and the busbars 72 of the front electrode 7 into partial regions of the P-type silicon substrate after manufacturing the fingers 71 and the busbars 72 of the front electrode 7, which effectively reduces the manufacturing processes of the local front surface fields of the back junction solar cell, and thereby reduces the cost of the back junction solar cell.

It is worth noting that the plurality of fingers 71 are arranged to be isolated from each other and the plurality of busbars 72 are arranged to be isolated from each other. Therefore, the plurality of local front surface fields 6 corresponding to the plurality of fingers 71 are arranged in isolation, and the local front surface fields 6 corresponding to the plurality of busbars 72 are also arranged in isolation.

Specifically, the above plurality of fingers 71 and the above plurality of busbars 72 are formed by physical deposition of pure metal aluminum, for the following reasons: if the fingers 71 and the busbars 72 are printed using a process of printing an aluminum paste in the existing techniques, the aluminum paste contains organic components, which will affect the film-forming effect of the second passivation anti-reflection layer 8 to be subsequently manufactured and the performance and aesthetics of the solar cell. Specifically, if the fingers 71 and the busbars 72 are printed using the existing process of printing an aluminum paste, firstly, since the second passivation anti-reflection layer 8 is formed by vapor deposition and the organic components contained in the aluminum paste may be volatilized and doped into the reactants of the second passivation anti-reflection layer 8 during vapor deposition, the density, purity, uniformity and the like of the second passivation anti-reflection layer 8 will be affected, such that the film-forming effect of the second passivation anti-reflection layer 8 will be relatively poor; secondly, due to the presence of organic components, the organic components contained in the aluminum paste continue to volatilize during the gas deposition of the second passivation anti-reflection layer 8, which makes it difficult to achieve a vacuum degree required for gas deposition, and thereby makes it difficult for the passivation anti-reflection film to meet the anti-reflection and passivation performance requirements of the solar cell. In addition, since the organic components contained in the aluminum paste enter the second passivation anti-reflection layer 8, the center of the P-type silicon substrate will be whitened or a color difference will appear in the center of the P-type silicon substrate, which affects the effect and appearance of the solar cell. In order to solve this design defect, the design of the embodiments of the present disclosure, in which a plurality of fingers 71 and a plurality of busbars 72 are formed through physical deposition of pure metal aluminum, can satisfy the requirement that the passivation anti-reflection layer 8 covers the plurality of fingers 71 and the plurality of busbars 72 so as to ensure the passivation and anti-reflection effects of the second passivation anti-reflection layer 8 and effectively ensure the performance and appearance of the solar cell.

In addition, since an existing aluminum paste used in the manufacturing of grid lines by printing an aluminum paste contains inorganic glass frits, a layer of non-conductive glass bodies is present between a prepared aluminum electrode and a silicon substrate, and the contact resistance is relatively large. Different from an aluminum electrode prepared by an aluminum paste, the contact resistance of fingers and busbars formed by pure metal aluminum is greatly decreased, which can greatly reduce current losses and improve current collection capabilities. In addition, metal aluminum grid lines partially replace the burn-through silver paste with a high cost and low conductivity, which further improves the filling factors of the cell while significantly reducing the cost.

In addition, the fingers 71 and the busbars 72 are formed by physical deposition of pure metal aluminum, which effectively reduces the laser grooving processes and avoids damage caused by laser to the surface of the silicon substrate.

Further, compared with the widths of the existing grid lines (fingers or busbars) obtained by printing an aluminum paste, which are generally not less than 30 μm (microns), the widths of the fingers 71 and busbars 72 formed by physical deposition of pure metal aluminum in the embodiments of the present disclosure can be controlled to be relatively small. Specifically, the widths of the fingers 71 and/or the busbars 72 may be 5 μm to 20 μm. For example, the width of the fingers may be 5 μm, 6 μm, 7 μm, 9 μm, 10 μm, 12 μm, 14 μm, 15 μm, 16 μm, 18 μm, 19 μm, 20 μm and so on. For another example, the width of the busbars may be 5 μm, 6 μm, 7 μm, 8 μm, 10 μm, 11 μm, 12 μm, 14 μm, 15 μm, 16 μm, 17 μm, 18 μm, 19 μm, 20 μm and so on. A decrease in the widths of the fingers 71 and the busbars 72 can also result in a further increase in the light absorbing area on the front side of the back junction solar cell.

Further, in order to solve the problem that aluminum in an aluminum electrode would affect the soldering performance of a silver solder pad when it penetrates into the silver pad, i.e., in order to solve the problem that an aluminum electrode affects the connection between a silver pad and a solder strip, and meanwhile, in order to solve the problem that a deep energy level would be easily generated in a silicon substrate and a recombination center would be formed once silver in a silver pad, after penetrating into an aluminum electrode or aluminum busbars, penetrates together with aluminum into the silicon substrate, the back junction solar cells in the embodiments of the present disclosure may further comprise a metal nickel barrier layer 10 arranged between the front electrode 7 and the front pad 9, as shown in FIGS. 3 to 6. Specifically, the metal nickel barrier layer 10 can be arranged on the front sides of the finger 71 and the busbar 72 of the front electrode 7 (the front sides are the sides facing the sun during the use of the back junction solar cell) as shown in FIGS. 3 and 4, and the metal nickel barrier layer 10 can be also arranged on the front side of the busbar 72 of the front electrode 7 as shown in FIGS. 5 and 6. In addition, the metal nickel barrier layer 10 can be also arranged only at a position where the front solder pad 9 is arranged on the front side of the busbar 72. By arranging a metal nickel barrier layer, aluminum and silver can be effectively prevented from being penetrated into each other, such that the photoelectric conversion efficiency of the back junction solar cell would be further improved.

In the embodiments of the present disclosure, the number of fingers 71 included in the front electrode 7 is generally smaller than the number of fingers included in the back electrode 5, so as to further increase the front area for light absorption of the back junction solar cell, thereby further improving the photoelectric conversion efficiency of the back junction solar cell.

It is worth noting that FIGS. 1 to 6 only exemplarily illustrate part of the structure of the back junction solar cell, and the back junction solar cell may also comprise other structures not shown in FIGS. 1 to 6, such as busbar lines arranged on the back side, back pads, and the like.

Figure 7:
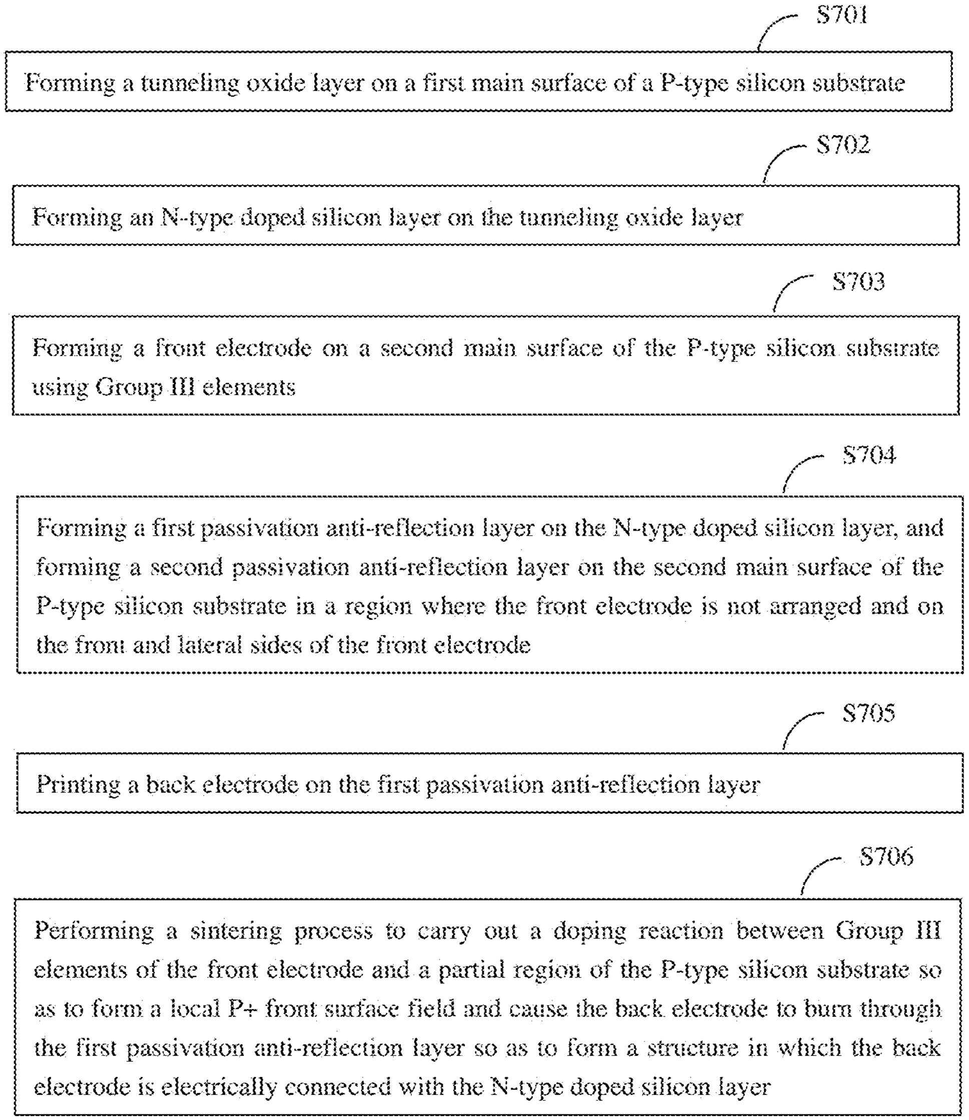
FIG. 7 is a schematic diagram of the main process of a preparation method for a back junction solar cell provided according to an embodiment of the present disclosure.

Further, as shown in FIG. 7, an embodiment of the present disclosure provides a preparation method for a back junction solar cell, so as to obtain the back junction solar cells in the above respective embodiments. The preparation method may comprise:

Step S701: Forming a tunneling oxide layer on a first main surface of a P-type silicon substrate.

The specific implementation of step S701 may include: depositing a silicon dioxide tunneling oxide layer using an atomic layer deposition technique at a temperature of 100 °C to 500 °C. In this manner, a nano-scale silicon dioxide tunneling oxide layer with a relatively uniform layer thickness that meets the requirements can be obtained, wherein the deposited silicon dioxide tunneling oxide layer has a thickness of 0.5 to 2 nm, preferably 1.0 to 1.8 nm. For example, the silicon dioxide tunneling oxide layer has a thickness of 1 nm, 1.2 nm, 1.3 nm, 1.4 nm, 1.5 nm, 1.7 nm, 1.8 nm or the like, such that the silicon dioxide tunneling oxide layer with a relatively smaller thickness can achieve a better tunneling effect.

Step S702: Forming an N-type doped silicon layer on the tunneling oxide layer.

The specific implementation of step S702 may include: growing an intrinsic polysilicon layer or an intrinsic amorphous silicon layer on the tunneling oxide layer 2; implanting phosphorus ions into the intrinsic polysilicon layer or the intrinsic amorphous silicon layer through ion implantation; forming the intrinsic polysilicon layer implanted with phosphorus ions or the intrinsic amorphous silicon layer implanted with phosphorus ions into an N-type doped polysilicon layer or an N-type doped amorphous silicon layer by high-temperature annealing, wherein the annealing temperature is 800 °C to 950 °C. Through the above process, the N-type doped silicon layer 3 formed at this step can have a thickness of 100-200 nm. For example, the N-type doped silicon layer 3 which is formed has a thickness of 100 nm, 120 nm, 140 nm, 150 nm, 170 nm, 180 nm, 200 nm, or the like.

Growing an intrinsic polysilicon layer or an intrinsic amorphous silicon layer on the tunneling oxide layer 2 may refer to growing an intrinsic polysilicon layer or an intrinsic amorphous silicon layer on the tunneling oxide layer 2 by low pressure chemical vapor deposition or physical deposition.

By using N-type doped polysilicon or N-type doped amorphous silicon, a good field passivation function can be realized and the carrier lifetime can be significantly improved. Moreover, the tunneling oxide layer and the doped polysilicon or doped amorphous silicon layer are arranged on the back side of the silicon substrate, which can reduce the front metal-semiconductor recombination and decrease the front metal-semiconductor contact resistance. With the arrangement of the doped silicon layer on the back side of the silicon substrate, the influences of the doped silicon layer on the absorption of incident light can be avoided. The good field passivation function of doped polycrystalline or amorphous silicon can significantly improve the minority carrier lifetime. The tunneling oxide layer and the polysilicon layer or amorphous silicon layer are arranged on the back side of the silicon substrate, which can reduce the front metal-semiconductor recombination and decrease the front metal-semiconductor contact resistance. With the arrangement of the doped silicon layer on the back side of the silicon substrate, the influences of the doped silicon layer on the absorption of incident light can be avoided.

Step S703: Forming a front electrode 7 on a second main surface of the P-type silicon substrate using Group III elements.

Specifically, the second main surface of the P-type silicon substrate 1 is covered with a grid line mask, and metal aluminum is deposited through physical deposition on the second main surface of the P-type silicon substrate 1 in a region which is not covered by the grid line mask, thereby forming aluminum fingers and aluminum busbars crossing the aluminum fingers. The physical deposition may be evaporation, ion plating, magnetron sputtering, or the like. Through physical deposition, metal aluminum can be deposited in a specific region to form aluminum fingers and aluminum busbars.

Step S704: Forming a first passivation anti-reflection layer 4 on the N-type doped silicon layer 3, and forming a second passivation anti-reflection layer 8 on the second main surface of the P-type silicon substrate in a region where the front electrode is not arranged and on the front and lateral sides of the front electrode;

wherein forming the first passivation anti-reflection layer 4 and forming the second passivation anti-reflection layer 8 can be completed simultaneously.

Specifically, the first passivation anti-reflection layer 4 and the second passivation anti-reflection layer 8 are formed using a material containing one or more of the following first type of compounds and one or more of the following second type of compounds:

the first type of compounds including: aluminum oxide, silicon oxide and gallium oxide;

the second type of compounds including: silicon nitride, aluminum nitride and silicon oxynitride.

Step S705: Printing a back electrode 5 on the first passivation anti-reflection layer 4.

Step S706: Performing a sintering process to carry out a doping reaction between Group III elements of the front electrode and a partial region of the P-type silicon substrate 1 so as to form a local P+ front surface field 6 and cause the back electrode 5 to burn through the first passivation anti-reflection layer 4 so as to form a structure in which the back electrode 5 is electrically connected with the N-type doped silicon layer 3.

Through the above processes, a doping reaction is carried out between Group III elements of the front electrode and a partial region of the P-type silicon substrate 1 to form a local P+ front surface field 6 by a sintering process, which reduces a process of separately setting a P+ front surface field, simplifies the manufacturing process of the back surface field solar cells, and reduces the manufacturing cost.

In addition, by the above preparation method, the first main surface of the P-type silicon substrate can be provided with a tunneling oxide layer, an N-type doped silicon layer and a first passivation anti-reflection layer which are sequentially arranged in a stacked manner from inside to outside and with a back electrode which penetrates through the first passivation anti-reflection layer to be electrically connected with the N-type doped silicon layer, and the second main surface of the P-type silicon substrate can be provided with a P+ local front surface field formed by Group III elements and a front electrode formed by Group III elements, which reduces the occlusion of the light absorbing region, and meanwhile, reduces the front metal-semiconductor recombination, decreases the front metal-semiconductor contact resistance, avoids the influences of the doped silicon layer on the absorption of incident light, and improves the current collection efficiency of the solar cell. Furthermore, since the front electrode is connected to the local front surface field and the position of the local front surface field corresponds to the position of the front electrode, the effective light absorbing region of the back junction solar cell can be effectively increased, and the photoelectric conversion efficiency of the back junction solar cell can be effectively improved. The P+ local front surface field 6 formed by Group III elements and the front electrode 7 formed by Group III elements can effectively reduce carrier recombination in the metal-semiconductor contact region.

Further, since a second passivation anti-reflection layer is formed on the second main surface of the P-type silicon substrate in a region where the front electrode is not arranged and on the front and lateral sides of the front electrode, damage caused by the front electrode to the passivation anti-reflection layer on the front side of the solar cell is avoided, which effectively improves the anti-reflection and passivation effects of the front side of the solar cell.

An increase in the anti-reflection effect can result in an increase in the short-circuit current of the solar cell, and an increase in the passivation effect can result in an increase in the open circuit voltage of the solar cell, i.e., can result in an improvement of the photoelectric conversion efficiency of the solar cell to a certain extent.

In the embodiments of the present disclosure, the above preparation process may further comprise forming a front pad on a front busbar, which can be specifically implemented in two implementation manners.

Herein, the first implementation manner for forming a front pad on a front busbar is: after the above step S704, the preparation method may further comprise: forming a front pad 9 on the second passivation anti-reflection layer 8 in a partial region corresponding to an aluminum busbar. Accordingly, the sintering process of the above step S706 further causes the front pad 9 to burn through the second passivation anti-reflection layer 8 so as to form a structure in which the front pad 9 is electrically connected with the aluminum busbar, thereby further reducing the manufacturing process of the back junction solar cell.

It is worth noting that forming a front pad 9 on the second passivation anti-reflection layer 8 in a partial region corresponding to an aluminum busbar can be completed before or after the above step S705, which is not limited herein.

Herein, the second implementation manner for forming a front pad on a front busbar is: after step S706, the preparation method further comprises: grooving, by laser, a partial region of the second passivation anti-reflection layer 8 corresponding to an aluminum busbar, printing a low-temperature sintered silver paste in a grooved region, and forming a front pad 9 through low-temperature sintering, wherein the temperature for low-temperature sintering is 250 °C to 400 °C. For example, the temperature for low-temperature sintering may be 250 °C, 260 °C, 280 °C, 290 °C, 300 °C, 330 °C, 350 °C, 380 °C, 400 °C, and so on.

Further, in order to prevent silver in a silver front pad from being doped into the aluminum busbars and to prevent aluminum in the aluminum busbars from entering a silver front pad, after the above step S703 and before step S704, the preparation method may further comprise: forming a metal nickel barrier layer 10 on the aluminum busbars. The metal nickel barrier layer can block the silver front pad and the aluminum busbars from being penetrated into each other while ensuring an electrical connection between the silver front pad and the aluminum busbars.

An embodiment of the present disclosure also provides a photovoltaic module, which may comprise: a cell sheet made of the back junction solar cell of the above embodiment.

An embodiment of the present disclosure also provides a power station, which may comprise the photovoltaic module provided in the above embodiment.

The above preparation method will be described in details with several specific embodiments below.

Embodiment 1

Step A1: depositing a silicon dioxide tunneling oxide layer with a thickness of 1.4 nm on one main surface of the P-type silicon substrate using an atomic layer deposition technique at a temperature of 100 °C to 500 °C;

Step B1: growing an intrinsic polysilicon layer or an intrinsic amorphous silicon layer on the tunneling oxide layer using a LPCVD (Low Pressure Chemical Vapor Deposition) device; then implanting phosphorus ions into the intrinsic polysilicon layer or the intrinsic amorphous silicon layer using an ion implantation device, and performing high temperature annealing, wherein the annealing temperature is 800 °C to 950 °C, and the polysilicon layer or the amorphous silicon layer implanted with phosphorus ions is annealed to form an N-type doped silicon layer with a thickness of 100 to 200 nm;

Step C1: locally covering the other main surface of the P-type silicon substrate with a grid line mask, and forming front aluminum fingers and front aluminum busbars of the P-type silicon substrate which are not covered with the grid line mask into local front aluminum fingers and front aluminum busbars using one of the evaporation, ion plating and magnetron sputtering methods;

Step D1: forming a back passivation anti-reflection layer and a front passivation anti-reflection layer respectively on the N-type doped silicon layer and the other main surface of the P-type silicon substrate using silicon oxide and silicon oxynitride;

Step E1: printing a back metal electrode on the back passivation anti-reflection layer;

Step F1: sintering, such that a doping reaction is carried out between the P-type silicon substrate and the front aluminum fingers or the front aluminum busbars to form a local P+ front surface field, and at the same time, the back metal electrode burns through the back passivation anti-reflection layer to form an electrical connection with the N-type doped silicon layer;

Step G1: laser grooving the front passivation anti-reflection layer, printing in a grooved region, and subjecting a silver paste to low temperature sintering at a sintering temperature of 250 °C to 400 °C to form a front busbar silver pad on the front busbars.

The structure of the back junction solar cell obtained in the above Embodiment 1 can be shown in FIG. 1.

Embodiment 2

Step A2: depositing a silicon dioxide tunneling oxide layer with a thickness of 1.4 nm on one main surface of the P-type silicon substrate using an atomic layer deposition technique at a temperature of 100 °C to 500 °C;

Step B2: growing an intrinsic polysilicon layer or an intrinsic amorphous silicon layer on the tunneling oxide layer using a LPCVD (Low Pressure Chemical Vapor Deposition) device; then implanting phosphorus ions into the intrinsic polysilicon layer or the intrinsic amorphous silicon layer using an ion implantation device, and performing high temperature annealing, wherein the annealing temperature is 800 °C to 950 °C, and the polysilicon layer or the amorphous silicon layer implanted with phosphorus ions is annealed to form an N-type doped silicon layer with a thickness of 100 to 200 nm;

Step C2: locally covering the other main surface of the P-type silicon substrate with a grid line mask, and forming front aluminum fingers and front aluminum busbars of the P-type silicon substrate which are not covered with the grid line mask into local front aluminum fingers and front aluminum busbars using one of the evaporation, ion plating and magnetron sputtering methods;

Step D2: forming a metal nickel barrier layer on the front aluminum finger lines and the front aluminum busbar lines using one of the evaporation, ion plating and magnetron sputtering methods;

Step E2: forming a back passivation anti-reflection layer and a front passivation anti-reflection layer respectively on the N-type doped silicon layer and the other main surface of the P-type silicon substrate using aluminum oxide and silicon nitride;

Step F2: printing a front busbar silver pad on the front passivation anti-reflection layer and printing a back metal electrode on the back passivation anti-reflection layer, respectively;

Step G2: sintering such that a doping reaction is carried out between the P-type silicon substrate and the front aluminum fingers or the front aluminum busbars to form a local P+ front surface field, the front grid silver pad (4) burns through the front passivation anti-reflection layer to form an electrical connection with the front aluminum busbars, and at the same time, the back metal electrode burns through the back passivation anti-reflection layer to form an electrical connection with the N-type doped silicon layer.

The structure of the back junction solar cell obtained in the above Embodiment 2 can be shown in FIG. 3.

Embodiment 3

Step A3: depositing a silicon dioxide tunneling oxide layer with a thickness of 1.4 nm on one main surface of a P-type silicon substrate using an atomic layer deposition technique at a temperature of 100 °C to 500 °C;

Step B3: growing an intrinsic polysilicon layer or an intrinsic amorphous silicon layer on the tunneling oxide layer using a LPCVD (Low Pressure Chemical Vapor Deposition) device; then implanting phosphorus ions into the intrinsic polysilicon layer or the intrinsic amorphous silicon layer using an ion implantation device, and performing high temperature annealing, wherein the annealing temperature is 800 °C to 950 °C, and the polysilicon layer or the amorphous silicon layer implanted with phosphorus ions is annealed to form an N-type doped silicon layer with a thickness of 100 to 200 nm;

Step C3: locally covering the other main surface of the P-type silicon substrate with a grid line mask, and forming front aluminum fingers and front aluminum busbars of the P-type silicon substrate which are not covered with the grid line mask into local front aluminum fingers and front aluminum busbars using one of the evaporation, ion plating and magnetron sputtering methods;

Step D3: forming a metal nickel barrier layer on the front aluminum busbar lines using one of the evaporation, ion plating and magnetron sputtering methods;

Step E3: forming a back passivation anti-reflection layer and a front passivation anti-reflection layer respectively on the N-type doped silicon layer and the other main surface of the P-type silicon substrate using gallium oxide, aluminium nitride and silicon oxynitride;

Step F3: printing a front busbar silver pad on the front passivation anti-reflection layer and printing a back metal electrode on the back passivation anti-reflection layer, respectively;

Step G3: sintering such that a doping reaction is carried out between the P-type silicon substrate and the front aluminum fingers or the front aluminum busbars to form a local P+ front surface field, the front grid silver pad (4) burns through the front passivation anti-reflection layer to form an electrical connection with the front aluminum busbars, and at the same time, the back metal electrode burns through the back passivation anti-reflection layer to form an electrical connection with the N-type doped silicon layer.

The structure of the back junction solar cell obtained in the above Embodiment 3 can be shown in FIG. 5.

What is claimed is:

1. A back junction solar cell, comprising:

a P-type silicon substrate;

a tunneling oxide layer, an N-type doped silicon layer and a first passivation anti-reflection layer which are sequentially arranged on a first main surface of the P-type silicon substrate in a stacked manner from inside to outside;

a back electrode which penetrates through the first passivation anti-reflection layer to be electrically connected with the N-type doped silicon layer;

a P+ local front surface field formed by Group III elements and a front electrode formed by Group III elements arranged on a second main surface of the P-type silicon substrate, wherein the front electrode is connected to the local front surface field, and a position of the local front surface field corresponds to a position of the front electrode; and a second passivation anti-reflection layer formed on the second main surface of the P-type silicon substrate in a region where the front electrode is not arranged, and on front and lateral sides of the front electrode, wherein the front electrode is in direct contact with the second main surface of the P-type silicon substrate and with the P+ local front surface field, and the front electrode is disposed between the second main surface of the P-type silicon substrate and the second passivation anti-reflection layer such that no portion of the front electrode penetrates the second passivation anti-reflection layer, and wherein the P+ local front surface field consists of a partial region of the P-type silicon substrate doped with the Group III elements of the front electrode.

2. The back junction solar cell according to claim 1, further comprising:

a front pad which penetrates through the second passivation anti-reflection layer to be electrically connected with the front electrode.

3. The back junction solar cell according to claim 2, wherein:

the front electrode includes a plurality of fingers and a plurality of busbars crossing the plurality of fingers, each of the fingers and each of the busbars correspond to their own local front surface fields, respectively; and each of the fingers and each of the busbars are connected with their corresponding local front surface fields, respectively, wherein the second passivation anti-reflection layer covers front and lateral sides of each of the plurality of fingers and each of the plurality of busbars.

4. The back junction solar cell according to claim 3, wherein the front pad is electrically connected with the busbars.

5. The back junction solar cell according to claim 3, wherein the plurality of fingers and the plurality of busbars comprise aluminum.

6. The back junction solar cell according to claim 3, wherein widths of the fingers are 5 μm to 20 μm.

7. The back junction solar cell according to claim 2, wherein the front pad is a silver pad.

8. The back junction solar cell according to claim 7, further comprising:

a metal nickel barrier layer arranged between the front electrode and the front pad.

9. The back junction solar cell according to claim 1, wherein the local front surface field and the front electrode each comprise aluminum.

10. The back junction solar cell according to claim 1, wherein the front electrode includes a plurality of fingers, the back electrode includes a plurality of fingers, and a number of the fingers included in the front electrode is smaller than a number of the fingers included in the back electrode.

* * * * *